United States Patent
Frank et al.

(10) Patent No.: US 6,907,589 B2
(45) Date of Patent: Jun. 14, 2005

(54) SYSTEM AND METHOD FOR EVALUATING VIAS PER PAD IN A PACKAGE DESIGN

(75) Inventors: Mark D. Frank, Longmont, CO (US); Jerimy Nelson, Fort Collins, CO (US); Nathan Bertrand, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 149 days.

(21) Appl. No.: 10/368,988

(22) Filed: Feb. 19, 2003

(65) Prior Publication Data

US 2004/0163054 A1 Aug. 19, 2004

(51) Int. Cl.⁷ .............................................. G06F 17/50
(52) U.S. Cl. ............................................................ 716/5
(58) Field of Search ............................................... 716/5

(56) References Cited

U.S. PATENT DOCUMENTS

| | | | | |
|---|---|---|---|---|
| 5,963,729 A | * | 10/1999 | Aji et al. | 716/5 |
| 6,072,945 A | * | 6/2000 | Aji et al. | 716/5 |
| 6,086,627 A | * | 7/2000 | Bass et al. | 716/5 |
| 6,417,463 B1 | * | 7/2002 | Cornelius et al. | 174/263 |
| 6,829,754 B1 | * | 12/2004 | Yu et al. | 716/5 |

\* cited by examiner

Primary Examiner—Stacy A. Whitmore

(57) ABSTRACT

A method and software product evaluate vias, per pad, in an electronic design. One or more via per pad rules are formulated, and then the electronic design is processed to determine whether the vias of the electronic design violate the via per pad rules. In the event of a violation, one or more indicators are generated to identify vias that violate the via per pad rules. The indicators are visual indicators (e.g., via per pad DRCs) on a graphical user interface, and/or a textual report summarizing violations.

20 Claims, 9 Drawing Sheets

SYSTEM AND METHOD FOR EVALUATING VIAS PER PAD IN A PACKAGE DESIGN

RELATED APPLICATION

This application is related to the following commonly owned U.S. Patent applications, each of which is incorporated herein by reference: U.S. patent application Ser. No. 10/368,789, filed Feb. 19, 2003, titled "System and Method for Evaluating Power and Ground Vias in a Packaite Design"; U.S. patent application Ser. No. 10/368,837, filed Feb. 18. 2003, titled "System And Method For Evaluating Signal Coupling Between Differential Traces In A Package Design"; U.S. patent application Ser. No. 10/368,776, filed Feb. 19, 2003, titled "System And Method For Evaluating Signal Coupling Between Vias In A Package Design"; U.S. patent application Ser. No. 10/368,758, filed Feb. 19, 2003, titled "System And Method For Evaluating Signal Deviations In A Package Design"; and U.S. patent application Ser. No. 10/368,778, filed Feb. 19, 2003, titled "System And Method For Evaluating Signal Trace Discontinuities In A Package Design".

BACKGROUND

Prior art computer aided design (CAD) software is known to include complementary tool suites for designing and analyzing the package of a die, e.g., a microprocessor. A "package" is the physical interconnection between the die and, for example, a printed circuit board (PCB). A typical package has several interconnected layers between its top layer (L1), which connects to the die, and its bottom layer (L2), which connects to the PCB.

A package "design" is a hierarchical and symbolic digital model of the package circuit. Those skilled in the art appreciate that hardware description languages (HDLs) may be used to formulate this digital model. The digital model consists of linked design elements that simulate the package circuit. The design elements are for example digital representations of the transistors, resistors, logic gates, traces (i.e., intra-layer conductors), capacitors, vias (i.e., inter-layer connectors), and wire bonds that make up the simulated schematic circuit.

The design elements and interconnections are collated and defined in a design database, which is a textual representation of the package design. The design database may further describe the package design in terms of higher-layer cells consisting of two or more design elements, and the connections between cells. Each "net" in the package design describes the linked conductors (e.g., traces of a layer and vias between layers) that form a circuit between an input and an output of the package. The CAD software may automatically route traces within a given layer of the package design; it may further automatically route vias between layers of the package design.

The design database is processed by the CAD software to perform circuit simulation. The CAD software is for example used to model a signal through the package and over a net (i.e., a "signal net"). Substrate laminate technologies and bond interconnections may also be evaluated through the CAD software.

One exemplary prior art CAD software is Advanced Package Designer (APD) from Cadence Design Systems, Inc., of San Jose, Calif. Such CAD software is known to include verification procedures and dynamic feedback that evaluate design accuracy against a set of physical and electrical design rules, or constraints. Physical design constraints help to ensure manufacturability; electrical design constraints help to ensure electrical specifications of the design. By way of example, this CAD software generates a Design Rule Check (DRC) indicating whether the design meets the various constraints. The prior art CAD software also provides a graphical user interface to view all or part of the package design in two dimensions, for example in a flat or perspective rendition, or with layers overlaid relative to one another.

FIG. 1 illustrates one prior art system 10 for designing a package with prior art CAD software 12. CAD software 12 is stored within a computer 14, initially within a storage unit 16. A processor 18 of computer 14 operates CAD software 12 in response to user inputs at an input interface 20 (e.g., a computer keyboard and mouse). As those skilled in the art appreciate, when initialized, CAD software 12 may also load into internal memory 22 of computer 14. A human designer at input interface 20 then controls CAD software 12, through processor 18, to create a package design 24, also stored within memory 22. The designer can command processor 18 and CAD software 12 to graphically show package design 24 at a graphical user interface 26 (e.g., a computer monitor) of system 10. Illustratively, package design 24 is graphically depicted on a display 28 of graphical user interface 26 as a five-layer graphical model 24A shown in FIG. 2.

FIG. 2 illustrates detail of graphical model 24A. L1 of model 24A couples with a die, and L2 of model 24A couples with a PCB. Layers I(1), I(2) and I(3) of model 24A represent intermediate layers of package design 24. Layers L1, I(1), I(2), I(3), L2 are shown as distinct elements and without proper or to-scale orientations for ease of illustration. An illustrative signal net 30 is shown from an input connector 32 to an output connector 34 of model 24A. Signal net 30 traverses design elements in the form of traces and vias between connectors 32, 34: via 35 from connector 32 of L1 to trace 36 of I(1); trace 36 within I(1) from via 35 to via 38; via 38 from trace 36 of I(1) to trace 40 of I(2); trace 40 within I(2) from via 38 to via 42 from trace 40 of I(2) to trace 44 of I(3); trace 44 within I(3) from via 46, which terminates at connector 34 of L2.

Design 24 also has power vias 60 and ground vias 70 connected, respectively, to L2 power pads 62 and L2 ground 72. As known to those skilled in the art, power vias 60 are designed to provide power (i.e., a "power net") to layers L1, I(1)–I(3), L2 of design 24, for use by design elements and signals of these respective layers. Ground vias 70 similarly provide grounding (i.e., a "ground net") to layers L1, I(1)–I(3), L2 of design 24, for use by design elements and signals of these respective layers. Those skilled in the art appreciate that a typical design 24 can and usually does have many more power and ground vias 60, 70 (and respective power and ground pads 62, 72) than what is shown in FIG. 2; though only a few power and ground vias 60, 70 (and respective power and ground pads 62, 72) are shown for purposes of illustration.

With further regard to FIG. 1, CAD software 12 is also operable to generate a design database 50. In one example, design database 50 textually defines signal net 30 of FIG. 2: signal net 30 is defined by connectors 32, 24, traces 36, 40, 44, and vias 35, 38, 42, 46. Design database 50 also defines power and ground vias 60, 70, and L2 pads 62, 72. Design database 50 further includes parameters (often called a "netlist") to ensure that signal net 30 has start and end points (i.e., connectors 32, 34 for signal net 30). The netlist also typically defines physical size dimensions of package design 24. A designer can manipulate design database 50 to develop the desired package design 24.

CAD software 12 utilizes design rules 52 to generate one or more DRCs 54 in the event that a design element or signal net of package design 24 exceeds a manufacturing constraint or electrical specification. By way of example, design rules 52 may specify that a trace width of trace 36 is 20 μm, to ensure manufacturability. If a designer of system 10 implements trace 36 with 10 μm, for example, then CAD software 12 generates a DRC 54A, which may be graphically displayed on model 24A, as shown in FIG. 2. The user is thus made aware that a problem may exist with trace 36.

Those skilled in the art appreciate that package design 24 often has more than the five layers illustrated in model 24A; however only five layers are shown in FIG. 2 for ease of illustration. For example, it is common that package design 24 include ground layers between each layer with signal traces I(1), I(2) and I(3); however these ground layers are not shown to simplify illustration. Those skilled in the art also appreciate that package design 24 also typically has many more signal nets and other design elements than illustrated signal net 30.

FIG. 3 illustrates package model 24A in a side view. FIG. 3 further illustrates how package design 24 connects between a die 80 and a PCB 82. Connector 32 is for example a pad that connects with a solder ball 84 of die 80; connector 34 is for example a pad that connects with signal wires of PCB 82. Similarly, power vias 60 connect with PCB 82 through power pad 62, while ground vias 70 connect with PCB 82 through ground pad 72.

The increased complexity of the modem die has correspondingly increased the complexity of the package design. An example of a complex die includes a Precision Architecture-Reduced Instruction Set Computer (PA-RISC) processor produced by Hewlett Packard Corporation, which has over one billion components. The package for the PA-RISC processor must maintain high signal integrity through its signal nets; however the prior art CAD software does not evaluate the inductance and/or power goals (e.g., safety and/or DC voltage drop goals) of the package as desired by the corresponding die. Accordingly, the package may be physically manufactured, at great expense, before the designer learns that the package is not suitable for operation with the die. By way of example, while the DRCs generated by the prior art CAD software may assist in manufacturability, they do not warn the designer of power and ground delivery problems between the die and the package. Specifically, prior art CAD software 12 does not evaluate the number of power vias 70 and ground vias 70, per pad, of package model 24A. An appropriate number of these power and ground vias 60, 70, per pad, are nonetheless preferred to provide proper signal integrity, voltage differentials, safety and inductances within the package.

SUMMARY OF THE INVENTION

A method evaluates vias, per pad, in an electronic design. First, one or more via per pad rules are formulated. The electronic design is then processed to determine whether the vias of the electronic design violate the via per pad rules. In the event of a violation, an indicator (e.g., a via per pad DRC and/or report) is generated to identify the non-conforming vias.

In one aspect, the step of processing includes the step of processing the vias relative to a designated pad (e.g., a designated ground or power pad) of the electronic design.

In another aspect, the step of processing includes the step of processing the vias relative to a designated capacitor coupled with the electronic design.

In one aspect, the via per pad rules define a via per power pad count for a power pad of the electronic design. In this aspect, the step of processing includes the step of counting power vias coupled with the power pad and then comparing a number of the power vias to the via per power pad count of the via per pad rules.

Similarly, in one aspect the via per pad rules define a via per ground pad count for a ground pad of the electronic design. In this aspect, the step of processing includes the step of counting ground vias coupled with the ground pad and comparing a number of the ground vias to the via per ground pad count of the via per pad rules.

A software product is also provided. The software product has instructions, stored on computer-readable media, wherein the instructions, when executed by a computer, perform steps for evaluating vias per pad in an electronic design. These steps include: determining instances of vias per pad within the electronic design; comparing the instances to one or more via per pad rules; and generating an indicator associated with the electronic design to identify violations of the via per pad rules. The software product may further formulate one or more of the via per pad rules.

Various ones of the methods, systems and products herein may provide certain advantages. In one example, a computer system configured with the via per pad evaluation software can count ground and/or power vias, per pad, in a package design to meet desired package performance and safety goals. Since a via can only handle a certain amount of current, the system of one aspect ensures that these via current limits are not exceeded, throughout the package design, by notifying the designer whether a minimum number of vias exists, per power and/or ground pad. In one exemplary aspect, the number of vias per pad established in the via per pad rules are based on DC voltage, current and/or inductance goals of the package. For example, if a package design has 35 L2 pads for a given power net (e.g., to deliver a voltage supply VDD to the package), a power simulation of the package design determines that one or two vias, per pad, does not meet the inductance or DC voltage drop goals of the package. The via per pad rules then establish a requirement of three vias, per pad (i.e., 105 total vias for the 35 L2 pads, in this example). The via per pad evaluation software then checks each VDD pad, for example, to make sure that three vias per power pad are available for power delivery. A similar number of vias per pad may be evaluated for each L1 and L2 pad connected to a capacitor, and/or for each L2 ground pad. Even if a power evaluation determines that the inductance or other power goals of the package are satisfied with one via, per pad, another via per pad rule may establish that at least two vias per pad exist to provide redundancy in case of a failure.

DETAILED DESCRIPTION OF THE DRAWINGS

Figure 1:
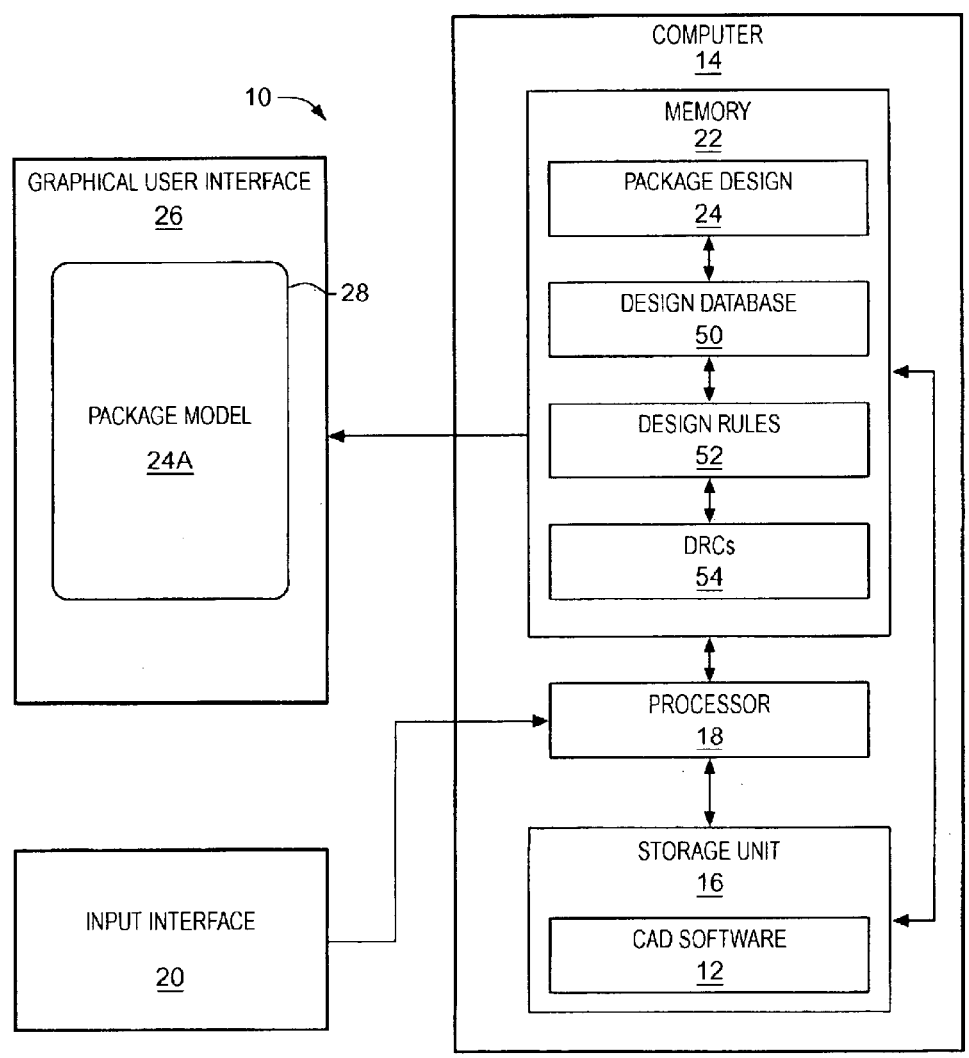
FIG. 1 shows a prior art system and CAD software for designing a package.
Figure 2:
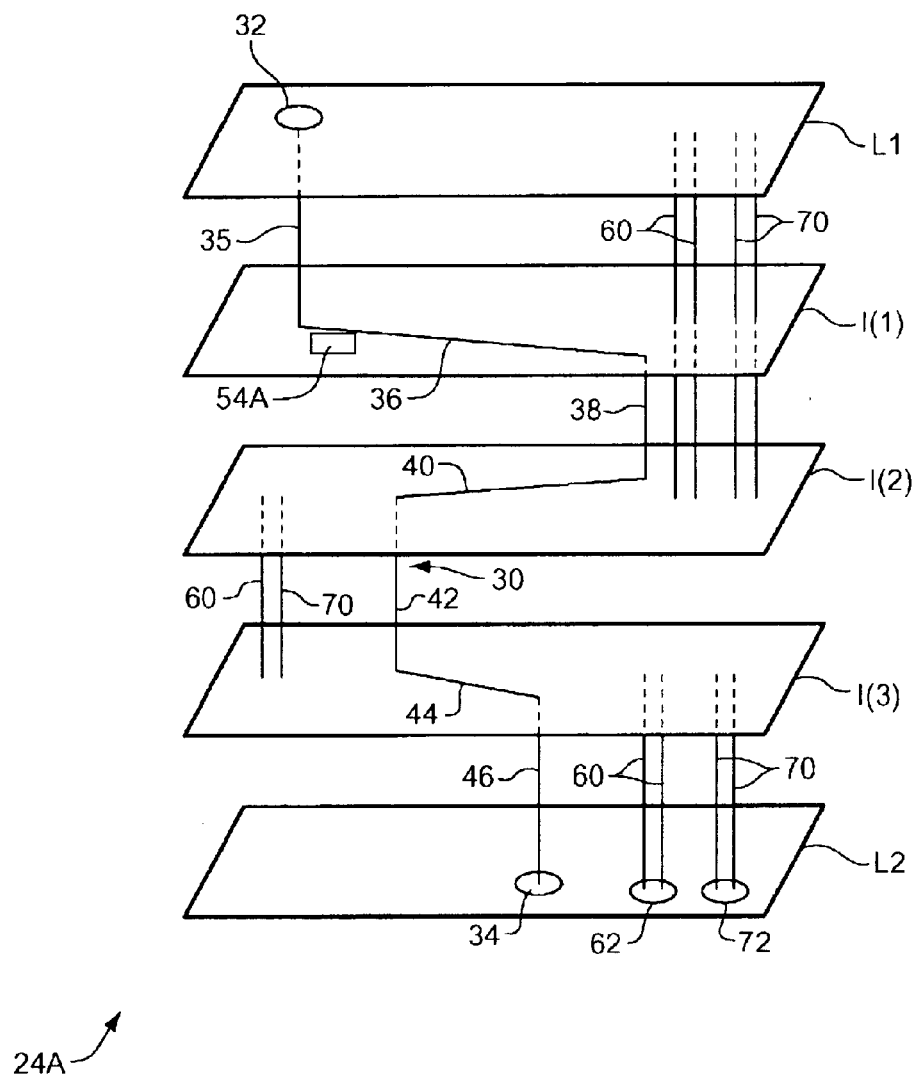
FIG. 2 shows, in a perspective view, one illustrative graphical model of the package design of FIG. 1.
Figure 3:
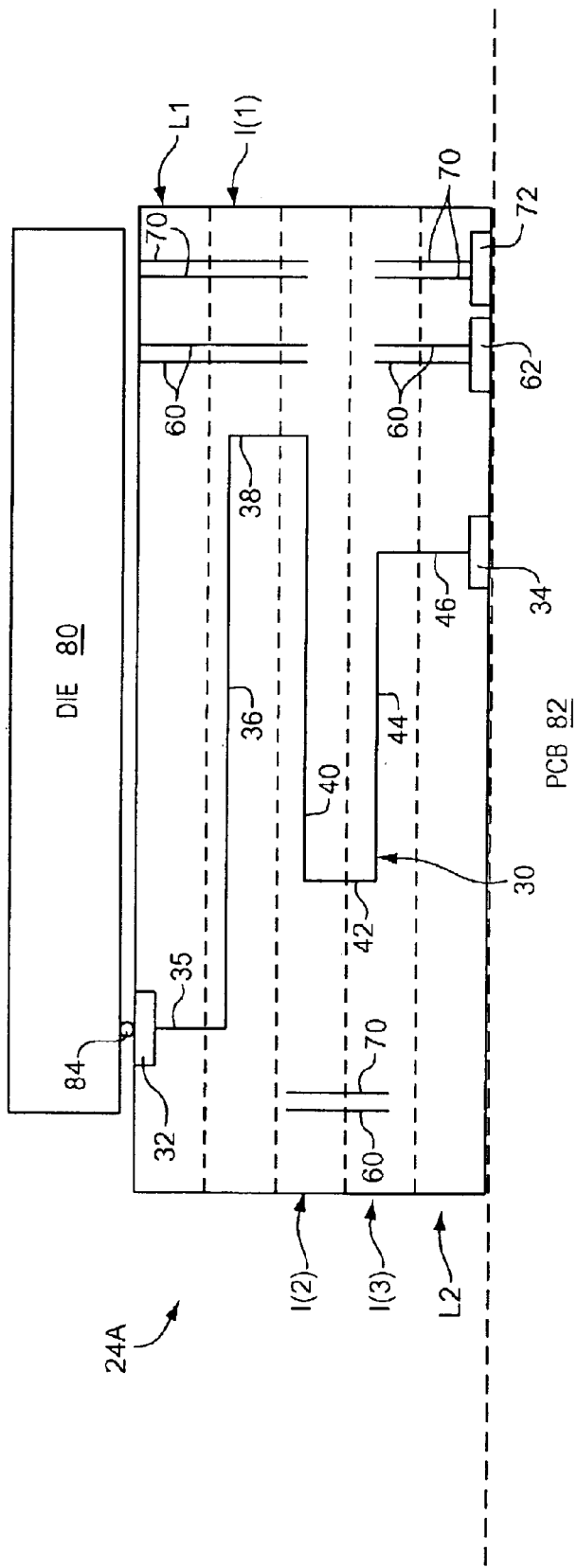
FIG. 3 illustrates the package design of FIG. 1 in a side view.
Figure 4:
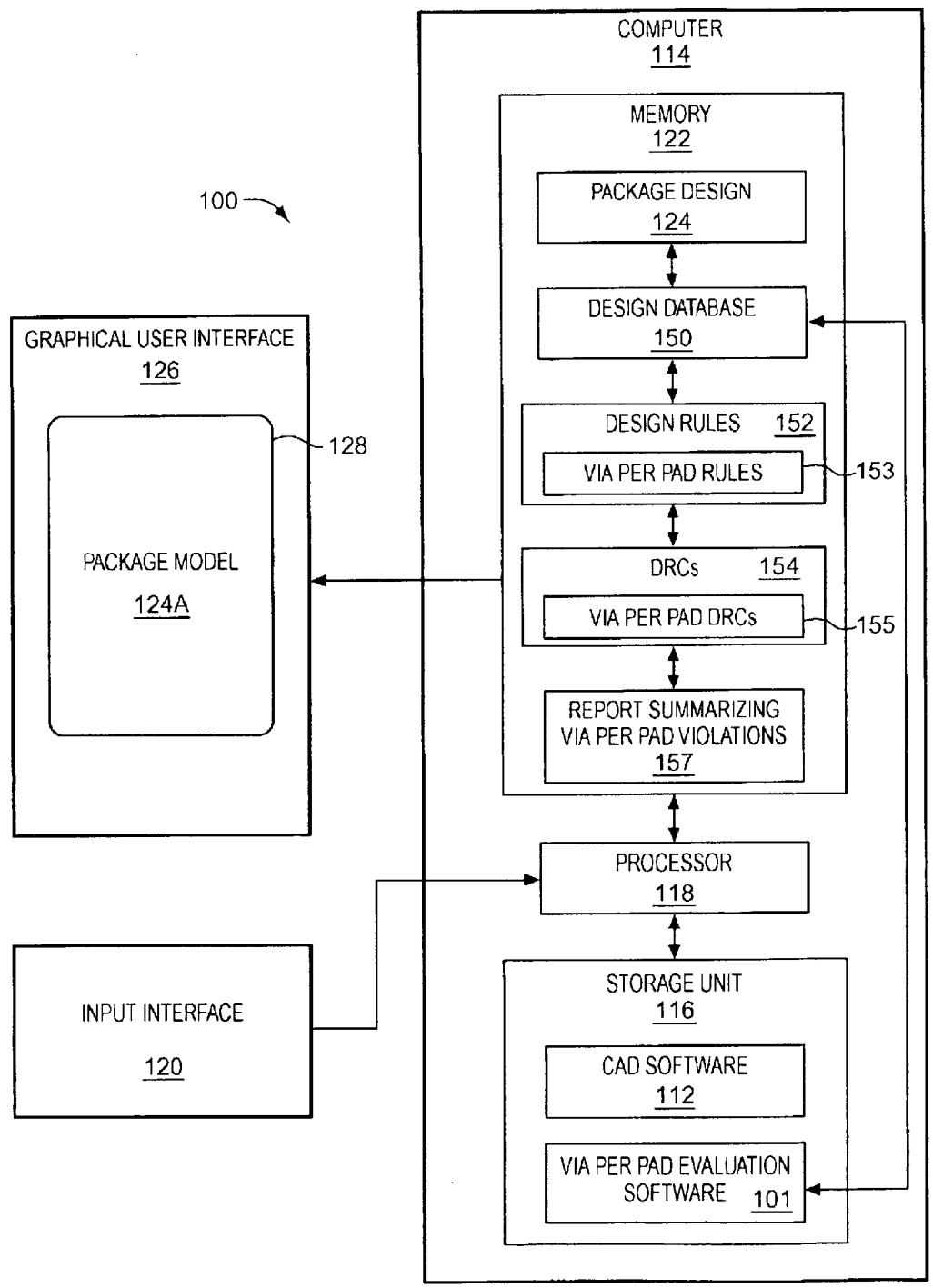
FIG. 4 shows one system for evaluating vias per pad in a package design.
Figure 5:
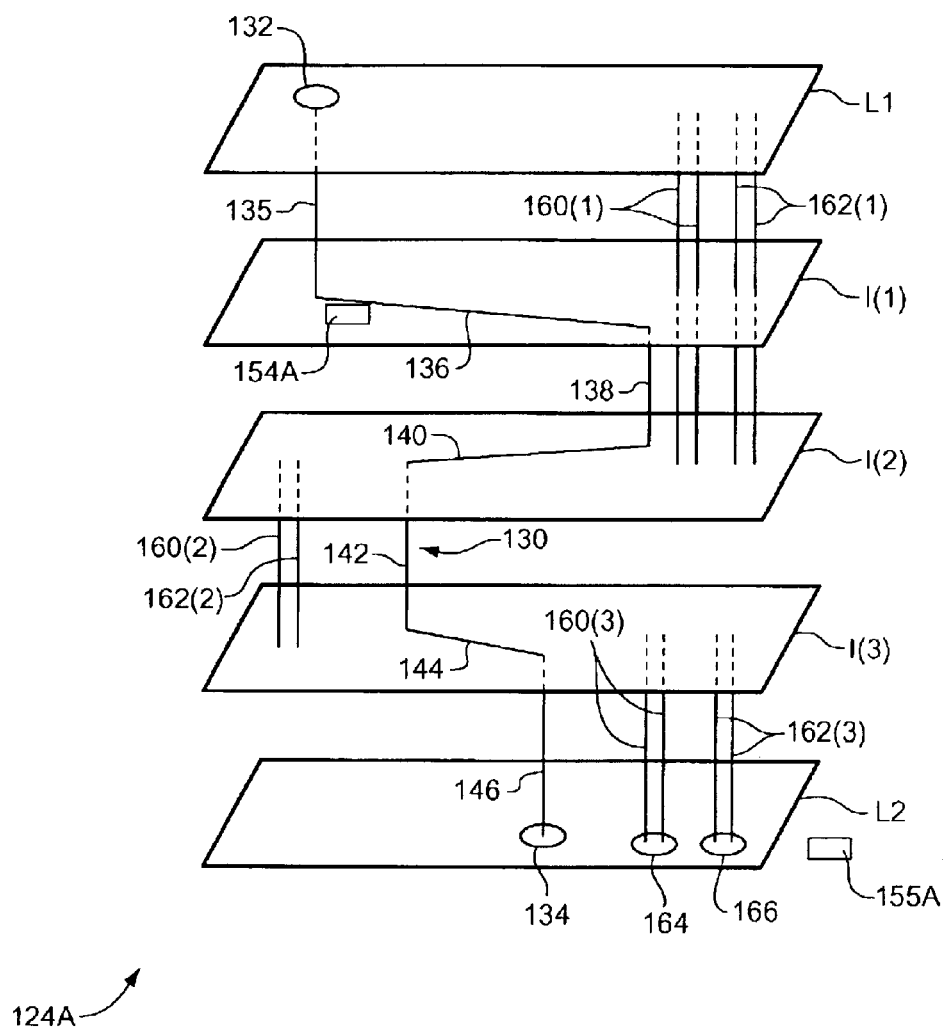
FIG. 5 illustrates one package design processed by the system of FIG. 4.

FIG. 4 shows one system 100 for designing and evaluating a package design utilizing CAD software 112 and via per pad evaluation software 101. CAD software 112 and via per pad evaluation software 101 are stored within a computer 114, initially within a storage unit 116. A processor 118 of computer 114 operates CAD software 112 and via per pad evaluation software 101 in response to user inputs at an input interface 120 (e.g., a computer keyboard and mouse). When initialized, CAD software 112 and via per pad evaluation software 101 may load into internal memory 122 of computer 114 as sets of instructions. A human designer at input interface 120 may then control CAD software 112 and via per pad evaluation software 101, through processor 118, to create a package design 124, also stored within memory 122. The designer can command processor 118 and CAD software 112 to graphically show package design 124 in one or more dimensions at a graphical user interface 126 (e.g., a computer monitor) of system 100. Illustratively, package design 124 is graphically depicted on a display 128 of graphical user interface 126 as a five-layer package model 124A, shown and described in connection with FIG. 5. In FIG. 5, L1 of model 124A couples with a die, and L2 of model 124A couples with a PCB. Layers I(1), I(2) and I(3) of model 124A represent intermediate layers of package design 124. Layers L1, I(1), I(2), I(3), L2 are shown as distinct elements and without proper or to-scale orientations for ease of illustration.

An illustrative signal net 130 is shown in FIG. 5 from an input connector 132 to an output connector 134 of model 124A. Signal net 130 traverses design elements in the form of traces and vias between connectors 132, 134: via 135 from connector 132 of L1 to trace 135 of I(1); trace 135 within I(1) from via 135 to via 138; via 138 from trace 135 of I(1) to trace 140 of I(2); trace 140 within I(2) from via 138 to via 142; via 142 from trace 140 of I(2) to trace 144 of I(3); trace 144 within I(3) from via 142 to via 146, which terminates at connector 134 of L2.

Layers L1, I(1)–I(3), L2 receive power and ground from, respectively, power and ground vias 160, 162, to support the signal nets (e.g., signal net 130) traversing layers L1, I(1)–I(3), L2 and the design elements disposed with each layer. Power vias 160 are for example represent the "power net" to layers L1, I(1)–I(3), L2 of design 124, while ground vias 162 represent the "ground net" to layers L1, I(1)–I(3), L2 of design 124. Power vias 160 and ground vias 162 connect, respectively, to L2 power and ground pads 164, 166. Those skilled in the art appreciate that a typical design 124 can and usually does have many more power and ground vias 160, 162 (and respective power and ground pads 164, 166) than what is shown in FIG. 5; though only a few power and ground vias 160, 162 (and respective power and ground pads 164, 166) are shown for purposes of illustration.

CAD software 112 is operable to generate a design database 150. In one example, design database 150 textually defines signal net 130, including connectors 132, 134, traces 136, 140, 144, and vias 135, 138, 142, 146. Design database 150 also textually defines power and ground vias 160 and 162, respectively, and associated power and ground pads 164, 166.

Via per pad evaluation software 101 is operable to process design database 150 to locate and evaluate vias within package design 124, as described in more detail below. Design database 150 includes parameters (e.g., a netlist) to set physical parameters of package design 124 that ensure, for example, signal net 130 has appropriate start and end points (i.e., that signal net 130 has start and end points 132, 134, respectively). A designer can manipulate design database 150 to develop the desired package design 124. As a matter of design choice, via per pad evaluation software 101 may be combined with CAD software 112.

CAD software 112 processes design database 150 and utilizes design rules 152 to generate one or more Design Rule Checks (DRCs) 154 in the event that a design element or signal net of package design 124 exceeds a manufacturing constraint or electrical specification. One DRC 154A is illustratively shown in model 124A, for example illustrating non-manufacturability of trace 136. A DRC 154 may also be a textual indicator, for example a statement written to a report 157, described below. Illustratively, such a textual DRC 154 may for example state: DRC 154A=trace 135 violates physical constraint of 20 μm.

Figure 8A:
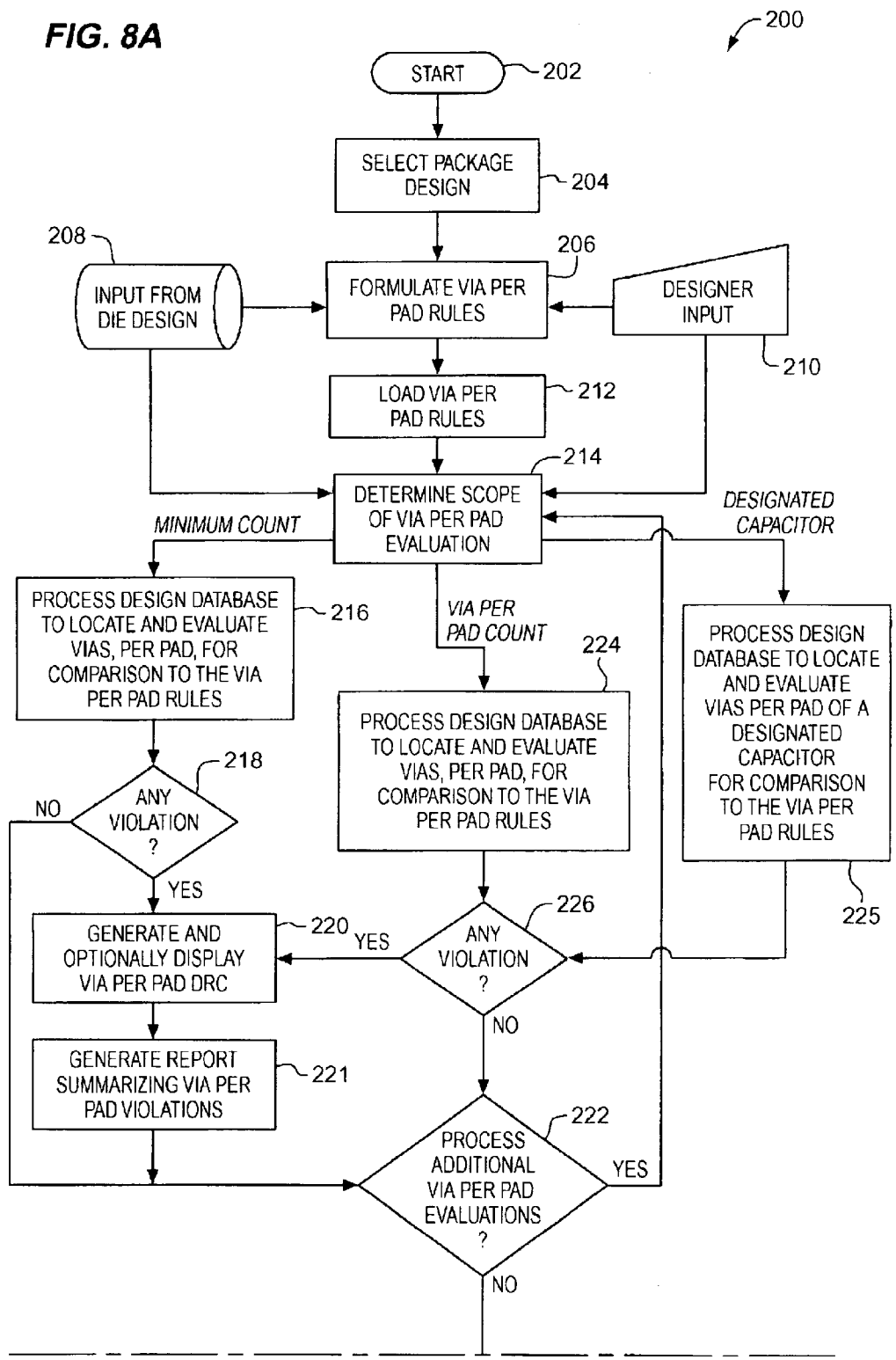
FIG. 8A and FIG. 8B show a flowchart illustrating one method for processing a package design to evaluate vias per pad.
Figure 8B:
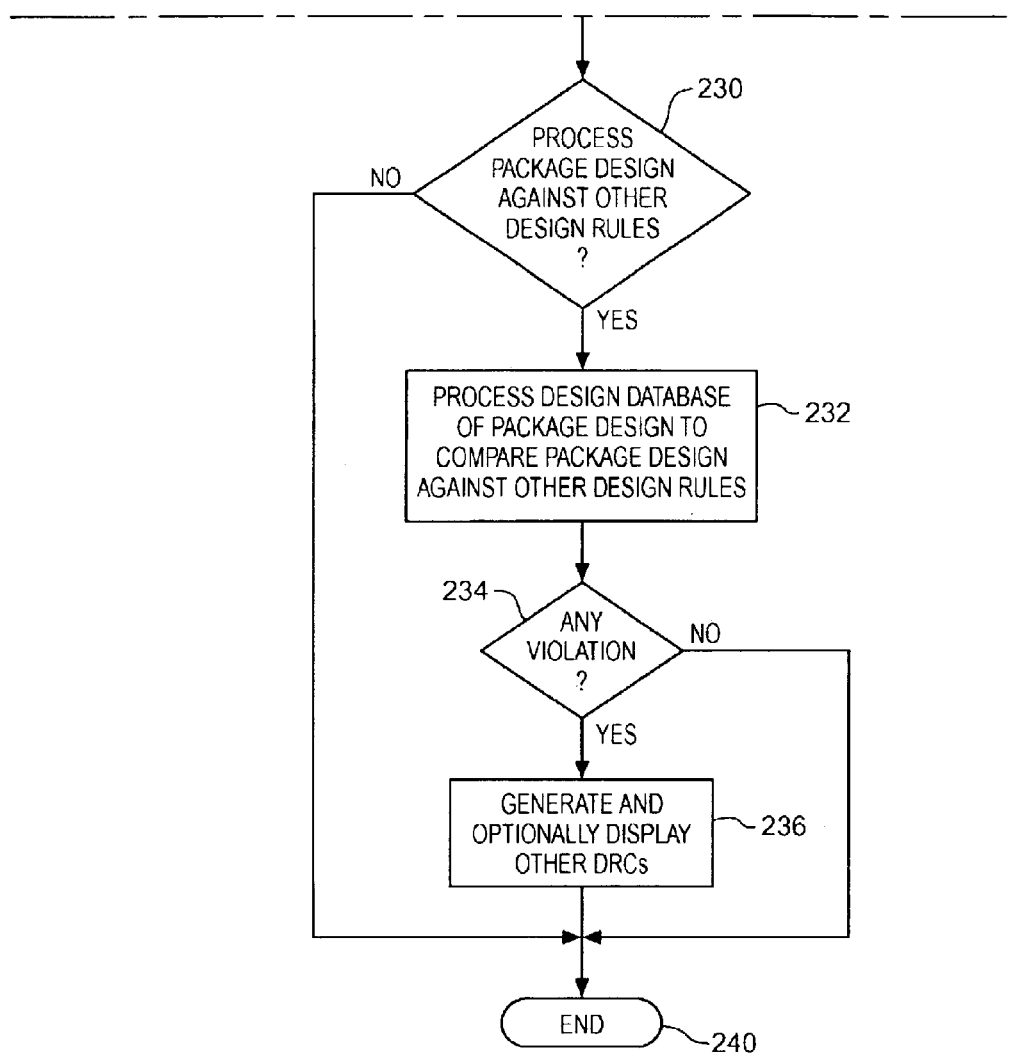

Via per pad evaluation software 101 processes design database 150 and utilizes via per pad rules 153 to generate one or more via per pad Design Rule Checks (DRCs) 155. One DRC 155A is illustratively shown in FIG. 5, indicating a violation of via per pad rules 153. DRC 155A for example illustrates that an improper number of power vias 160(3) and/or ground vias 162(3) exist in comparison to via per pad rules 153. All violations of via per pad rules 153 may be summarized in a report 157 managed by via per pad evaluation software 101. FIG. 8A and FIG. 8B describe the operation of system 100 in its generation and utilization of via per pad rules 153 and DRCs 155.

Illustratively, representative via per pad rules may be stated textually as in the following non-limiting examples:

(1) Each ground pad should have a minimum of two ground vias.

(2) Each power pad should have a minimum of two power vias.

(3) Each power pad should have N power vias (N being an integer determined through power simulation of the package design).

(4) Each ground pad should have M ground vias (M being an integer determined through power simulation of the package design).

These illustrative rules can be combined or executed individually, for example. Rules 1 and 2 help ensure redundancy in a package design, in case of a via failure. Rules 3 and 4 are made with specific values of M and N, respectively, to match inductance and power delivery goals of the package design.

A DRC 155 may also be a textual indicator, for example a statement written to report 157. Illustratively, such a textual DRC 155 may for example state: DRC 155A=there is an insufficient number of power vias 160 associated with L2 power pad 164. Or, for example, the textual DRC 155 may state: DRC 155A=there is an insufficient number of ground vias 162 associated with L2 ground pad 166.

Figure 6:
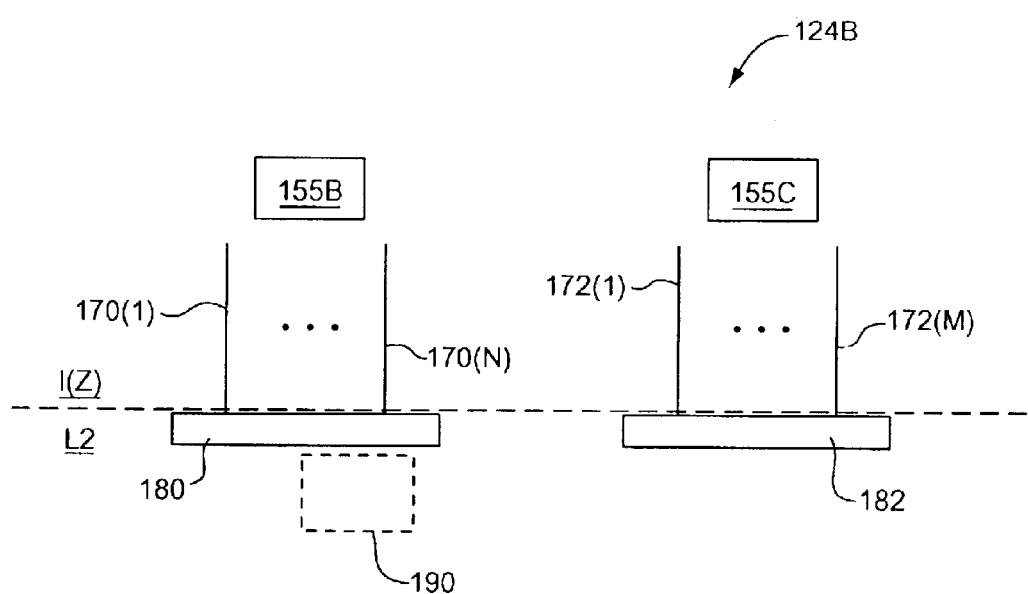
FIG. 6 illustrates one other package design processed by the system of FIG. 4.

FIG. 6 schematically illustrates a package design 124B showing L2 and an intermediate layer I(Z). One power via 170(1), or a plurality (N) of power vias 170(N) (N an integer greater than or equal to one), couple to a power pad 180 of L2 to provide power to intermediate layers such as I(Z) of package design 124B. One ground via 172(1), or a plurality (M) of ground vias 172 (M) (M an integer greater than or equal to one), couple to a ground pad 182 of L2 to provide ground to intermediate layers such as I(Z) of package design 124B. As described in more detail below, via per pad evaluation software 101, FIG. 4, is operable to determine whether there are a sufficient number of power vias 170 connected with pad 180 to meet designer goals set forth in via per pad rules 153. If power vias 170 do not comply with one or more via per pad rules 153, a via per pad DRC 155B may be created to warn the designer of the offending vias 170, such as illustrated in FIG. 6. Similarly, via per pad evaluation software 101, FIG. 4, is operable to determine whether ground vias 172 meet designer goals set forth in via per pad rules 153. If ground vias 172 do not comply with one or more via per pad rules 153, a via per pad DRC 155C may be created to warn the designer of the offending vias 172, such as illustrated in FIG. 6.

Finally, FIG. 6 also illustrates that a capacitor 190 may couple with a power pad 180, as shown. Via per pad evaluation software 101 is also operable to determine whether power vias 170 meet designer goals for capacitor 190 as set forth in via per pad rules 153. If power vias 170 do not comply with one or more via per pad rules 153, a via per pad DRC (such as DRC 155C) may be created to warn the designer of the offending vias 172.

Figure 7:
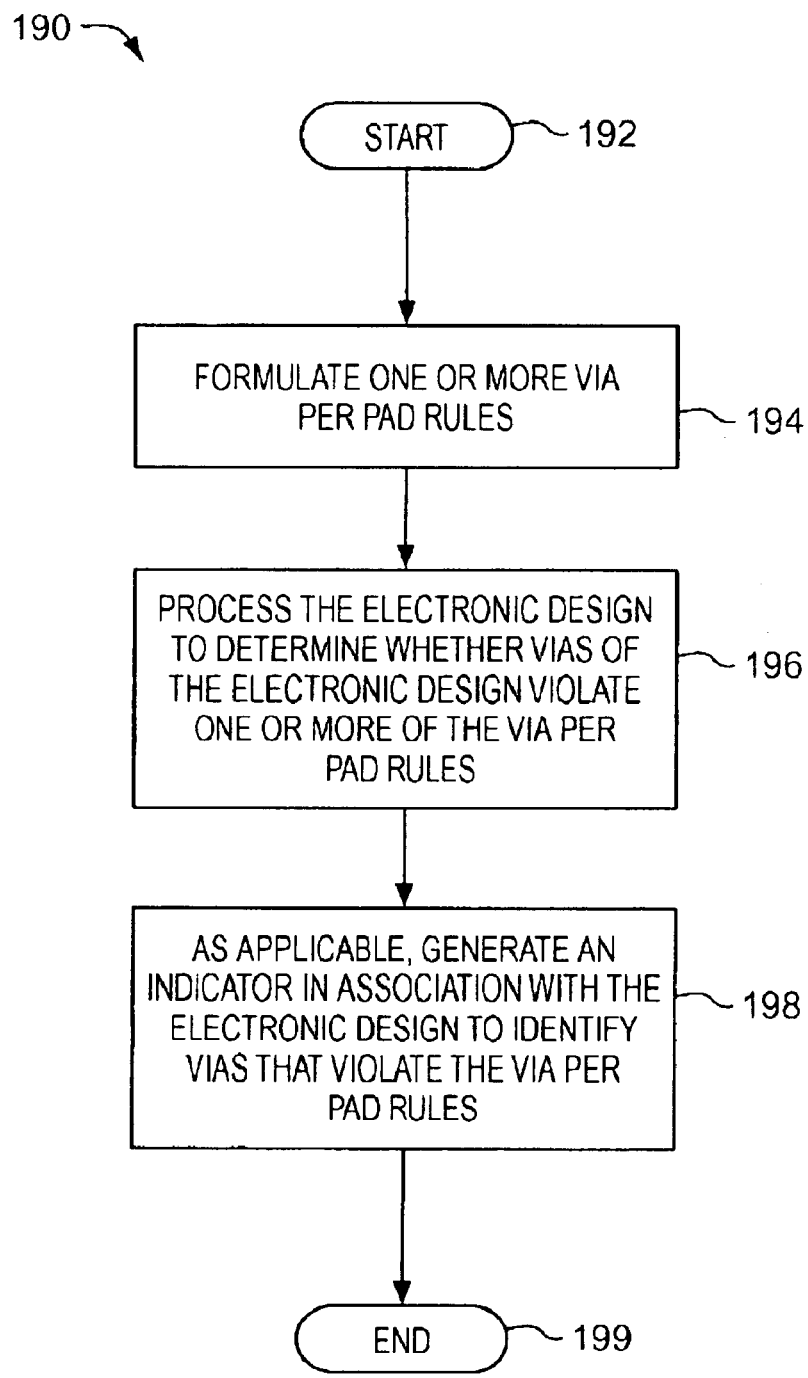
FIG. 7 is a flowchart illustrating one process for evaluating vias per pad in an electronic design.

FIG. 7 is a flowchart illustrating one process 190 for evaluating vias per pad in an electronic design. After start 192, one or more via per pad rules are formulated, in step 194. In step 196, the electronic design is processed to determine whether the vias of the electronic design violate one or more of the via per pad rules. In step 198, an indicator is generated in association with the electronic design to identify vias that violate the via per pad rules, if any. Process 190 terminates at 199.

FIG. 8A and FIG. 8B show a flowchart illustrating one process 200 for generating and utilizing via per pad rules (e.g., rules 153) and via per pad DRCs (e.g., DRCs 155) with respect to a package design (e.g., design 124). System 100 of FIG. 4 for example utilizes process 200 to generate DRC 154A and DRC 155A in FIG. 5.

After start 202, a package design is selected in step 204; by way of example, step 204 may automatically select a current package design 124 being created by CAD software 112.

At step 206, via per pad rules are created. Process 200 shows two exemplary techniques for creating via per pad rules. In one example, via per pad rules are formulated 206 by processing input specifications of the die which couples with the package design, as indicated by direct data input 208. In another example, a designer manually formulates 206 via per pad rules, as indicated by designer input 210. The formulated via per pad rules are loaded to computer memory (e.g., memory 122, FIG. 4) in step 212, so that the via per pad rules may operate with the package design selected in step 204. Via per pad evaluation software 101, FIG. 4, may perform or facilitate some or all of steps 206–212.

Step 214 determines the scope of subsequent via per pad evaluations. Illustratively, this determination 214 may derive from direct data input 208 associated with die specifications, or from designer inputs 210. The outputs of step 214 associate with the scope determined in step 214.

In one example, pads of the package design are evaluated for a "minimum count" relative to the via per pad rules. For example, one via per pad rule may state that each power and/or ground pad should have at least two power and/or ground vias, to provide redundant power and/or ground to the package design. Computer 114 of system 100 responds to the request to evaluate and process design database 150 to locate and evaluate vias relative to the "minimum count" via per pad rules 153, as indicated by step 216. For example, model 124A, FIG. 5, is selected, then vias 160, 162 are detected and compared against via per pad rules 153; since two vias per pad exist in FIG. 5, a DRC 155 is not necessary.

Step 218 is a decision. If the detected vias violate one or more of the via per pad rules, one or more via per pad DRCs 155 are generated (and optionally displayed with model 124A, for example as DRC 155A), as indicated by step 220. Optionally, a designer may also publish a report summarizing violations of the via per pad rules, as in step 221. If no violation occurs, processing continues with step 222.

In another option, from step 214, a "via per pad count" evaluation of a package design is processed for validation against the via per pad rules. Computer 114 of system 100 responds to the request and processes design database 150 to evaluate the via per pad count, as indicated by step 224. For example, if both power and ground vias 170, 172, respectively, of model 124B, FIG. 6, are selected for the scope of the evaluation, then, in step 224, vias 170, 172 are evaluated and compared against via per pad rules 153. If the via per pad rules state that there should be three (N=3) power vias 170 and four (M=4) ground vias 172, then via per pad evaluation software 101 assesses the count (N and/or M) to determine whether to issue a warning (e.g., a DRC 155B or 155C) of the violation.

Step 226 is a decision. If one or more vias violate one or more of the via per pad rules, one or more via per pad DRCs 155 are generated (and optionally displayed with model 124A, for example, as DRC 155A), as indicated by step 220. If no violation occurs, processing continues with step 222.

In another option, from step 214, a "designated capacitor" evaluation of a package design is processed for validation against the via per pad rules. Computer 114 of system 100 responds to the request and processes design database 150 to evaluate the via per pad count for the designated capacitor, as indicated by step 225. For example, in FIG. 6, if capacitor 190 connected with power pad 180 is selected, then, in step 225, vias 170 are evaluated and compared against via per pad rules 153. If the via per pad rules state that there should be four (N=3) power vias 170, then via per pad evaluation software 101 assesses the count (N) to determine whether to issue a warning (e.g., a DRC 155B) of the violation, as in steps 226, 221.

Step 222 is a decision. If additional via per pad evaluations (with differing scope) are designated, step 214 repeats; otherwise, process 200 continues with step 230. Step 230 is a decision. If the package design is to be evaluated against other design rules (e.g., rules 152, FIG. 4), step 232 processes the design database relative to the other design rules. Step 234 is a decision. If other DRCs 154 exist due to violation of the other design rules, process 200 continues with step 236; otherwise process 200 ends at step 240. In step 236, one or more other DRCs (e.g., DRC 154A, FIG. 4) may be generated and optionally displayed.

The following "pseudo" code illustrates one example for performing via per pad rule checks in a package design.

```
********Pseudo Code*******
VARIABLES :
Die_Specification :          (Structure to contain specifics for die selected)
Die_Specification_File :     (Name of file containing die specifications)
Package_Design_List :        (Structure to contain a list of all design elements
                              of the package design in the design database)
Design_Element_List :        (Structure to contain a list of design elements
                              selected from the Package_Design_List)
Design_Name :                (Variable identifying the specific design to be
                              validated)
Designer_Selected_Layer :    (Variable to store a designer-selected layer)
Design_Rule_List :           (Structure to contain a list of via per pad rules)
Design_Rule_Checks_List :    (Structure to contain a list of rule violations)
{Load Specification for the die used by the package into a list variable.}
Die_Specification := LoadDieSpecificationFromFile(Die_Specification_File);
{Load the package design from the package design database}
Package_Design_List := LoadPackageDesign(Design_Name);
{Generate die specific design rules from the die specification}
Design_Rule_List := GenerateDesignRules(Die_Specification);
{Add any design rules input by the designer}
Design_Rule_List := Design_Rule_List + Input_Designer_Rules();
{Input the layer selected by the designer for this check}
Designer_Selected_Layer := Input_Designer_Layer_Choice();
{Select design elements from the package design for a single layer, as specified by the
designer}
Design_Element_List:= SelectDesignElementsForChecking(Package_Design_List,
                                                     Single_Layer,
                                                     Designer_Selected_Layer);
{Empty the list for storing the DRCs detected}
Design_Rule_Check_List := EMPTY;
{The Design_Rule_Check function tests each design element against all via design
rules in the Design_Rule_List, returning a DCR if a check fails. The DRC is added
to the Design_Rule_Checks_List for later processing.}
Design_Rule_Checks_List := Design_Rule_Check(Design_Element_List, Design_Rule_List);
IF COUNT_ITEMS_IN_LIST(Design_Rule_Checks_List) > 0 THEN
BEGIN
    {Generate a DRC report for all detected DCRs}
    Generate_Design_Rule_Check_Report(Design_Rule_Checks_List);
    IF Design_Rule_Check_Display_Selected THEN
    BEGIN
        {If the DRCs are to be displayed on screen, the
        Generate_Design_Rule_Check_Display function sends the detected DCRs
        for output on the display}
        Generate_Design_Rule_Check_Display(Design_Rule_Checks_List);
    END IF;
END IF;
```

In this pseudo code example, the Design_Element_List contains a list of all design elements in a designer_selected layer for a package design. The Design_Rule_Check function steps through all design rules in the Design_Rule_List, and tests each design element in the design element list to which the rule applies. Only pseudo code for one via per pad rule is shown in the case statement for clarity in this example. This via per pad rule is a rule that counts the number of vias per pad and compares the value to a minimum requirement stored in the rule definition.

```
FUNCTION Design_Rule_Check(Design_Element_List, Design_Rule_List) : DRC_List;
VARIABLES
Design_Rule_Index :       (Index variable used to step through Design_Rule_List)
Design_Element_Index :    (Index variable used to step through Design Element List)
Via_Count :               (Count variable to count Vias)
DRC_List :                (List to build the Returned DRCs)
Pad_Element_List :        (List of pads taken from Design_Element_List)
Pad_Index :               (Variable to index the Pad_Element_List)
BEGIN
    DRC_List := EMPTY;    {Clear the return DCR list}
    {Step through the design rules in the Design Rule List and check each design
    element in the Design Element List to which the rule applies. Accumulate DRCs
    in the DRC_List to be returned at the end of the function.}
    FOR Design_Rule_Index := 1 to COUNT_ITEMS_IN_LIST(Design_Rule_List) DO
    BEGIN
    CASE Design_Rule_List[Design_Rule_Index].Type OF
    . . .
    Via_Design_Rule:
    BEGIN
```

-continued

```
    {First Generate a list of all pads connected to vias in the
    Design_Element_List}
    Pad_Element_List := GeneratePadList(Design_Element_List);
    {Then count the vias per pad}
    FOR Pad_Index := 1 TO COUNT_ITEMS_IN_LIST(Pad_Element_List) DO
    BEGIN
        Via_Count = 0;
        FOR Design_Element_Index := 1 to
        COUNT_ITEMS_IN_LIST(Design_Element_List) DO
        BEGIN
            {Only process Via Design Elements that are connected to the current pad.}
            IF Design_Element_List[Design_Element_Index].Type = VIA AND
                Design_Element_List[Design_Element_Index].PadRef =
                            Pad_Element_List [ Pad_Index].PadRef
                THEN
                BEGIN
                    Via_Count := Via_Count + 1;
                END IF;
        END FOR;
        {Finished processing the Design Element for this pad, so make the rule
        evaluation.}
        IF Via_Count < Design_Rule_List[Design_Rule_Index].Minimum THEN
        BEGIN
            {The rule failed, so add the DCR to the DCR list to be returned on
            completion of the function}
            DRC_List := DRC_List + DRC(Design_Rule_List[Design_Rule_Index].Type);
        END IF;
    END FOR;
END Via_Design_Rule;
    . . .
    END CASE;
END FOR;
RETURN DRC_List; {Return the results for the Design Rule Check function}
END FUNCTION;
*******Pseudo Code End*******
```

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method for evaluating vias per pad in an electronic design, comprising the steps of:
   formulating one or more via per pad rules;
   processing the electronic design to determine whether the vias of the electronic design violate the via per pad rules; and
   generating an indicator associated with the electronic design to identify vias that violate the via per pad rules.

2. A method of claim 1, the step of processing comprising the step of processing the vias relative to a designated pad of the electronic design.

3. A method of claim 1, the step of processing further comprising processing the vias relative to a designated capacitor coupled with the electronic design.

4. A method of claim 1, wherein the via per pad rules define a via per power pad count for a power pad of the electronic design, the step of processing comprising the step of counting power vias coupled with the power pad and comparing a number of the power vias to the via per power pad count of the via per pad rules.

5. A method of claim 4, the via per power pad count being at least two to ensure redundancy.

6. A method of claim 4, the via per power pad count comprising N as determined by power simulation of the electronic design, N being an integer greater than or equal to two.

7. A method of claim 1, wherein the via per pad rules define a via per ground pad count for a ground pad of the electronic design, the step of processing comprising the step of counting ground vias coupled with the ground pad and comparing a number of the ground vias to the via per ground pad count of the via per pad rules.

8. A method of claim 7, the via per ground pad count being at least two to ensure redundancy.

9. A method of claim 7, the via per power pad count comprising M as determined by power simulation of the electronic design, M being an integer greater than or equal to two.

10. A method of claim 1, the step of generating an indicator comprising the step of generating at least one via per pad design rule check (DRC) for one or more violations of the via per pad rules when an insufficient number of vias couple with at least one pad.

11. A method of claim 10, the step of generating an indicator comprising the step of graphically depicting a DRC on a graphical user interface illustrating the electronic design.

12. A method of claim 10, the step of generating an indicator comprising the step of textually defining the via per pad DRC in a report.

13. A method of claim 1, the step of formulating comprising formulating the via per pad rules relative to one or more layer two (L2) pads.

14. A method of claim 1, wherein one of the via per pad rules specifies that each pad has at least two vias per pad.

15. A system for evaluating vias per pad in a package design, comprising:
   means for formulating one or more via per pad rules;
   means for storing the via per pad rules;
   means for counting vias per pad in the package design;

means for comparing a number of counted vias to the via per pad rules; and means for informing a user of violations of the via per pad rules.

16. A system of claim 15, the means for formulating comprising means for automatically inputting data from a die design.

17. A software product comprising instructions, stored on computer-readable media, wherein the instructions, when executed by a computer, perform steps for evaluating vias per pad in an electronic design, comprising:

determining instances of vias per pad within the electronic design;

comparing the instances to one or more via per pad rules; and generating an indicator associated with the electronic design to identify violations of the via per pad rules.

18. The software product of claim 17, further comprising formulating one or more of the via per pad rules.

19. The software product of claim 18, one of the via per pad rules defining that each pad has at least two vias.

20. The software product of claim 18, one of the via per pad rules defining a via count per pad for at least one of a layer two (L2) power and ground pad.

* * * * *

UNITED STATES PATENT AND TRADEMARK OFFICE
CERTIFICATE OF CORRECTION

PATENT NO. : 6,907,589 B2
APPLICATION NO. : 10/368988
DATED : June 14, 2005
INVENTOR(S) : Mark D. Frank et al.

It is certified that error appears in the above-identified patent and that said Letters Patent is hereby corrected as shown below:

In column 1, line 9, delete "Packaite" and insert -- Package --, therefor.

In column 2, line 36, after "38 to" insert -- via 42; --.

In column 2, line 37, after "from" insert -- via 42 to --.

In column 5, line 38, delete "135 of I(1); trace 135" and insert -- 136 of I(1); trace 136 --, therefor.

In column 5, line 39, delete "trace 135" and insert -- trace 136 --, therefor.

In column 6, line 19, delete "135" and insert -- 136 --, therefor.

Signed and Sealed this

Twenty-eighth Day of July, 2009

JOHN DOLL
*Acting Director of the United States Patent and Trademark Office*